United States Patent [19]

Gajjar

[11] Patent Number: 4,584,685
[45] Date of Patent: Apr. 22, 1986

[54] METHOD FOR IMPROVING MESSAGE RECEPTION FROM MULTIPLE SOURCES

[75] Inventor: Jagdish T. Gajjar, Clifton Park, N.Y.

[73] Assignee: General Electric Company, Schenectady, N.Y.

[21] Appl. No.: 564,160

[22] Filed: Dec. 22, 1983

[51] Int. Cl.⁴ ............................................. G06F 11/10
[52] U.S. Cl. ......................................... 371/35; 371/32
[58] Field of Search ...................... 371/35, 32, 37, 39, 371/40

[56] References Cited

U.S. PATENT DOCUMENTS

| | | | |
|---|---|---|---|
| 3,868,633 | 2/1975 | Nuese | 371/35 X |
| 4,238,852 | 12/1980 | Iga et al. | 371/40 |
| 4,344,171 | 8/1982 | Lin et al. | 371/35 |
| 4,398,292 | 8/1983 | Doi et al. | 371/39 |
| 4,400,810 | 8/1983 | Ive | 371/40 |
| 4,414,667 | 11/1983 | Bennett | 371/37 |
| 4,471,485 | 9/1984 | Prevot et al. | 371/35 |
| 4,479,215 | 10/1984 | Baker | 371/33 |

OTHER PUBLICATIONS

Lin et al., Hybrid Selective-Repeat ARQ with Finite Buffer, IBM Tech. Discl. Bulletin, vol. 24, No. 6, Nov. 1981, pp. 2883-2885.

Lin et al., Preventive Error Control Scheme, IBM Technical Discl. Bulletin, vol. 24, No. 6, Nov. 1981, pp. 2886-2891.

Tang et al., Hybrid GO-BACK-N ARQ with Extended Code Block, IBM Tech. Discl. Bulletin, vol. 24, No. 6, Nov. 1981, pp. 2892-2896.

Primary Examiner—Charles E. Atkinson
Attorney, Agent, or Firm—Bernard J. Lacomis; James C. Davis, Jr.

[57] ABSTRACT

A method for improving reception of a data word to be sent from an origination station to a destination station comprises generating and storing error correction functions for a message word including the data word. Error correction functions are transmitted only if the message word is invalidly received thus offering improved performance over a conventional retry scheme. Interleaving reduces susceptibility to burst noise and altering carrier frequency for retransmissions minimizes effects of noise. The method is especially useful in a system comprising a central receiver and a plurality of physically separated remote transmitters wherein electrical path quality between receiver and transmitters may independently randomly vary.

29 Claims, 2 Drawing Figures

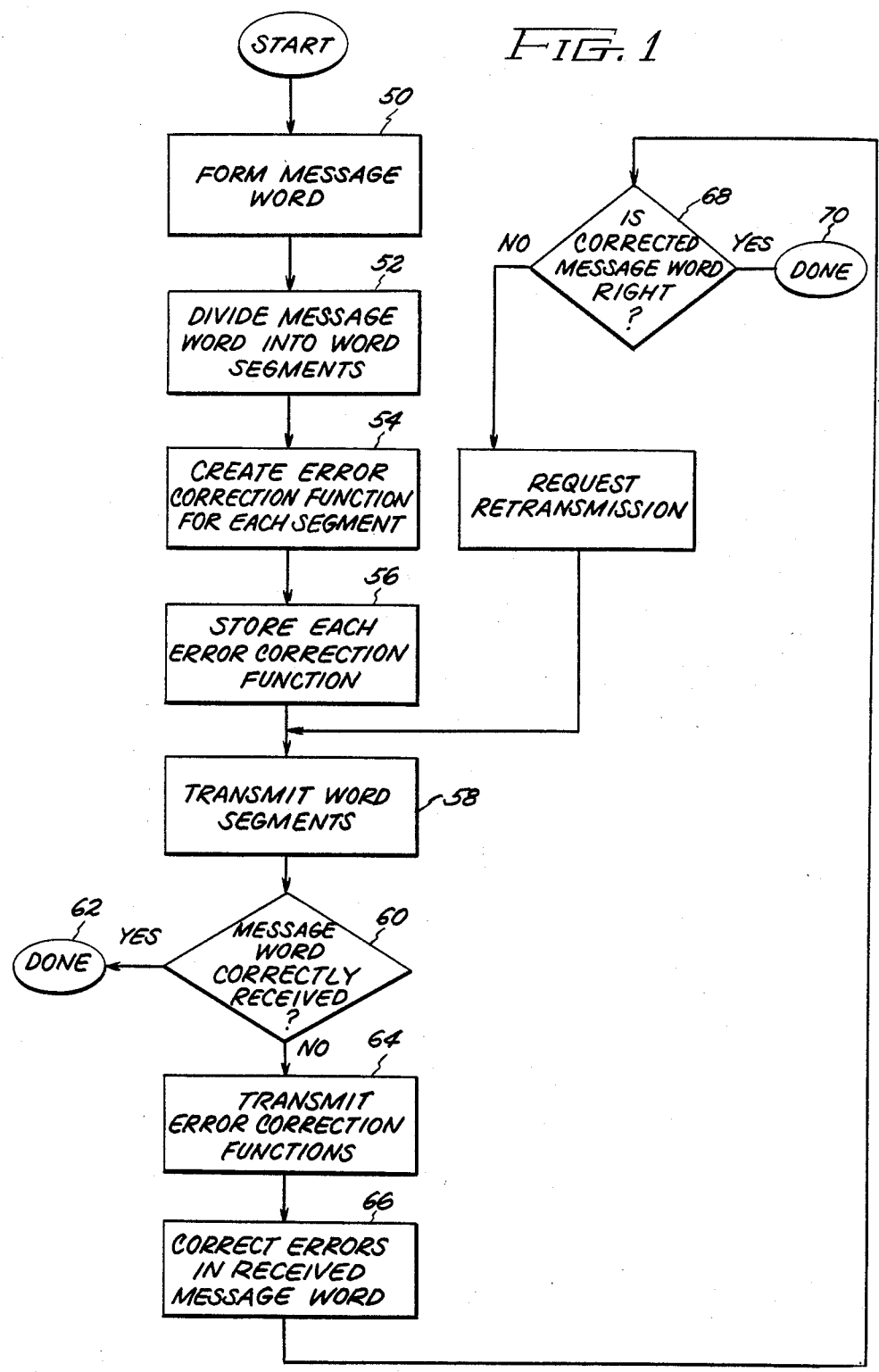

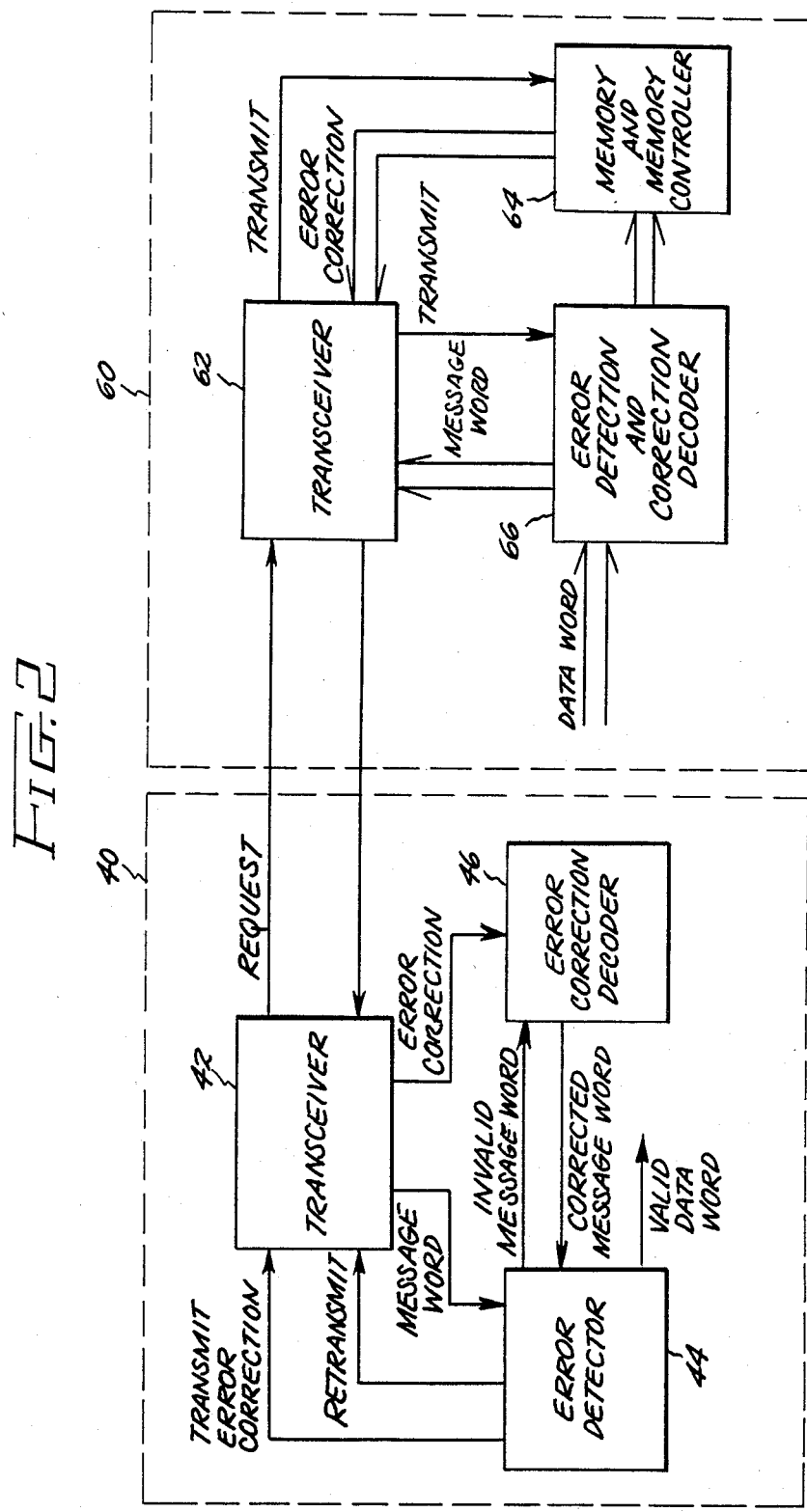

METHOD FOR IMPROVING MESSAGE RECEPTION FROM MULTIPLE SOURCES

BACKGROUND OF THE INVENTION

This invention relates to data communication and, more particularly, to a method for improving successful reception of binary messages without increasing overhead as compared with using a retry scheme for incorrectly received messages.

Data communication may be required from a plurality of physically dispersed remote stations to a central receiver. The communication medium may be situated in a hostile environment, such as power line carrier or factory communication system, which typically experiences randomly varying electrical characteristics, such as noise. Environmental factors affecting electrical characteristics may include lightning and operation of heavy machinery. Typically, transmissions from remote stations arrive at the central receiver with an acceptable signal-to-noise (S/N) ratio (i.e. low probability of bit error or less than about 0.0005). However, due to electrical path characteristics, transmissions from some remote stations may arrive at the central receiver with marginal S/N (i.e. high probability of bit error or greater than about 0.005). Additionally, data may be corrupted during travel along the transmission medium by momentary changes in electrical characteristics of the transmission path. Increasing the power of the transmitted data from the remote station in order to increase the S/N ratio is not always practicable, since an increase in power generally increases the cost of the transmitter, and for a system having many remote stations the increased cost may be infeasible. Also, it is generally desirable to employ the same transmission protocol for all remote stations in the system.

A typical scheme for data transmission over a communication medium in a master (i.e. requests data transmission)/slave (i.e. sends data in response to request) environment uses error detection at the master to determine the integrity of the message received from the slave. Alternatively, remote stations may transmit at predetermined intervals or when they have message words available wherein the central station requests a retry or retransmission only when a message word is detected as containing error. If an error is detected in the message by the master then an automatic repeat request (ARQ) may be sent from the master to the slave. Upon receipt of the ARQ, the slave retransmits the same message which had the error as detected by the master. With a high S/N data path, message retransmission or a variation thereof such as is described in chapter 15 of "Error Control Coding: Fundamentals and Applications" by Shu Lin and Daniel J. Costello, Jr. (1983) (hereinafter Lin and Costello), when an error is detected, offer an efficient strategy. Error detection may be implemented by any known coding technique, such as CRC16 or CRC32 (CRC=cyclic redundancy check) at the slave, with corresponding decoding at the master. These techniques typically involve concatenating a data word, i.e. intelligence, with an error detecting parity word at the slave to form a message word which is transmitted to the master.

For low (S/N) data paths over the transmission medium, such as may be experienced in power line carrier or factory environment communication systems, the probability of bit error may be relatively high (e.g. greater than about 0.005). In such cases, the probability of obtaining an error free message (given that the message first received included an error) using a single retry is very low. For example, if the probability of bit error is 0.02 and the message length including the CRC check is 228 bits, computations indicate that the probability of success using a single retry would be about 1.988 percent. It is generally desirable to employ the same message word transmission protocol for all remote stations in the system and further it is not usually known in advance of message word transmission which data paths may experience a degradation in electrical path quality.

Error correction codes, which are transmitted with the message, have been used on fading and other low S/N paths. However, generally these codes significantly increase the traffic rate, resulting in lower system transmission efficiency and are subject to correcting to a false message (i.e. message detected as having no errors by the master but not the message sent by the slave) when used in an environment subject to high bit error rates.

Accordingly, it is an object of the present invention to increase probability of successful message reception without increasing message traffic above that used with a conventional retry scheme.

Another object is to reduce the probability of correcting to false message.

Still another object is to increase the efficiency of a communication system having data transmission signal paths with randomly varying electrical characteristics.

BRIEF SUMMARY OF THE INVENTION

In accordance with the present invention, a method for improving reception of a data word to be sent from an origination station to a destination station comprises concatenating the data word and a security check word to form a message word, dividing the message word into a plurality of word segments and interleaving the plurality of words segments to form a modified message word. The modified message is divided into a second plurality of word segments and a respective error correction function, which is stored, is generated for each of the second plurality of word segments. The message word is transmitted to the destination station and the security check word of the received message word is used to verify the integrity of the received message word. If the received message word is verified as valid by using the respective security check word in a well known manner, the data word is declared validly received. If the data word is declared invalid, the respective error correction functions are sent to the destination station and are used to correct errors in the received message word. The corrected security check word of the corrected message word is used to verify the integrity of the corrected message word according to well known techniques. If the corrected message word is found to be valid by this process, the corrected data word is declared validly received. If found to be invalid, the message word is retransmitted, preferably at a different frequency, and the verification procedure is repeated.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

BRIEF DESCRIPTION OF THE DRAWING

FIG. 1 is a flow chart representing a method of data communication in accordance with the present invention; and FIG. 2 is a block diagram of apparatus useful with the present invention.

DETAILED DESCRIPTION

This invention relates to a method for improving successful reception of binary messages without increasing overhead as compared with using a conventional retry scheme for incorrectly received messages. Apparatus and methods for digitally encoding and decoding error correction and error detection codes may be found in references such as "Error-Correction Coding for Digital Communications" by George C. Clark, Jr. and J. Bibb Cain (1981) (hereinafter Clark and Cain) and Lin and Costello.

Shown in FIG. 1 is a flow diagram of a method for data communication in accordance with the present invention. The present invention may be employed in any data communication system, however, it is especially beneficial when used in a data communication system having a central receiver and a plurality of physically dispersed remote transmitters wherein the electrical quality of the communication medium between each remote transmitter and the central receiver may independently randomly vary.

Execution of step 50 forms a message word at the transmitter. A message word typically comprises a data word and a security check word which are concatenated. The data word typically includes system operating parameters encoded therein, such as transmitter identification, status, fault indication, and remote parameter data, and the security check word typically includes parity verification bits, such as a cyclic redundancy check (CRC-16). For transmission efficiency, each message word generally comprises a relatively large data word, say greater than about 100 bits, followed by the security check word. Execution of step 52 divides the message word into word segments. For example, a message word may consist of a 104-bit data word and a 16-bit security check word. The 120-bit message word may be divided into ten 12-bit word segments. The number of bits in each word segment is selected to be compatible with an error correction function discussed below. If a word segment is too short, i.e. doesn't have the required number of bits, trailing bits or place markers may be added to the word segment. Execution of step 54 creates an error correction function or code for each message word segment and execution of step 56 stores each respective error correction function at the transmitter. The generation of the error correction function or code is explained in the aforementioned references, Clark and Cain, and Lin and Costello. Interleaving may be affected by sequentially arranging a single bit from respective corresponding bit positions of each respective word segment of the first plurality of word segments. For example, a message word comprising three 12-bit words (111001011011/101011111001/100011101101)

may be interleaved as a 36-bit string (111100110000011111011110111001100111).

A preferred method comprises dividing the message word into a first plurality of word segments, wherein each word segment is compatible with an error correction function, and forming a modified message word by interleaving each of the first plurality of word segments at the transmitter. The modified message word is divided into a second plurality of word segments, wherein each word segment is compatible with an error correction function, and an error correction code is used to generate an error correction function for each of the second plurality of word segments as hereinbefore described. The respective error correction functions are stored at the transmitter.

Although any error correction code, such as those discussed in the aforementioned references, may be used to form an error correction function, a Golay (23, 12) code or an extended Golay (24, 12) code are calculated to be especially beneficial with the present invention. The Golay (23, 12) code will detect and correct three errors while the extended Golay (24, 12) code will correct three errors and detect four errors. For example, and not by way of limitation, a message word may include 120 bits consisting of a 104-bit data word and sixteen bits for a CRC-16 code. By dividing this message word into ten subwords or word segments (12 bits each) and creating an extended Golay (24, 12) code for each of the ten subwords, a group of ten-word segments with each word segment having a corresponding extended Golay (24, 12) code is formed. Execution of step 56 stores the error correction function or Golay subword for each respective word segment at the transmitter.

Briefly, a Golay code is a specific code defined as an (n,k) polynomial code in which each codeword is n bits long and contains k data or information bits. The codeword also includes (n−k) redundant check bits. The Golay code is a perfect code in that every bit pattern can be uniquely associated with a Hamming distance 3 to a unique codeword. The perfect nature of the Golay code is advantageous in that more errors can be corrected in a Golay codeword than in any other polynomial code of the same bit length. In general, a polynomial code is defined in terms of a generator polynomial g(x) which, for the Golay code, can be expressed in one well-known form by $$g(x) = x^{11} + x^{10} + x^6 + x^5 + x^4 + x^2 + 1.$$

The (n−k) redundancy check bits that must be appended to the n information or data bits are determined by multiplying the data bits by $x^{(n-k)}$ and dividing the result by the generator polynomial g(x) using modulo-2 arithmetic.

A properly generated and transmitted Golay codeword, if received in an error-free fashion, is an exact multiple of the generator polynomial g(x), that is, the codeword when divided by g(x) yields a remainder, or so-called "syndrome" word, of zero. If errors are introduced into a Golay codeword during transmission, the resulting syndrome word is other than zero, and error correction is achieved by adding a polynomial number, in a modulo-2 operation, to the codeword to make the codeword exactly divisible by g(x). The Golay code is a cyclic code in that any Golay codeword can be rotated or shifted left or right any number of bits and the result will be another valid Golay codeword exactly divisible by g(x).

Errors in a Golay codeword as discussed above can be "trapped", for example, by a Kasami algorithm. The Kasami error trapping algorithm tests a Golay codeword to detect one of three possible different error patterns and, depending on which error pattern is detected, alters the codeword to correct for the presence of the errors. Up to three errors, that is, three incorrect bits in a Golay codeword, can be corrected by the Kasami error trapping algorithm. The Kasami algorithm is described in detail in an article entitled "A Decoding Procedure for Multiple-Error-Correcting Cyclic Codes", by Tadao Kasami, IEEE Transactions on Information Theory, April, 1964, pp. 134–138.

Execution of step 58 transmits each word segment to the central receiver. Transmission of a message word may be in response to a command from the receiver at predetermined intervals or at random intervals after a transmitter has formed the message word. Each word segment may be serially transmitted to the receiver and it is generally preferred to interleave the data bits of each word segment. Interleaving reduces the effect of burst noise, i.e. noise which causes a plurality of contiguous data bits to be distorted. Interleaving may be effected, for example, by sequentially transmitting the first bit of each respective word segment, then sequentially transmitting the second bit from each word segment and repeating the pattern of sequential transmission of one bit from each respective word segment until the entire message word has been transmitted. Execution of step 60 at the receiver uses the security check word, which forms a portion of the message word received by the receiver, to determine if the received message word is correctly received. If correspondence with the security check word is obtained, transmission has been successfully completed and step 62 is performed to indicate that the received message word is valid.

If the received message word is invalid by the above-noted process, step 64 is performed to request that the transmitter transmit the respective error correction functions which were previously stored. Transmission of error correction functions or Golay subwords is preferably interleaved as hereinbefore described. Upon receiving transmitted error correction functions, step 66 is performed to correct errors in the corresponding received message word. After correcting errors in the received message word, step 68 is performed to determine if the corrected message word corresponds to the corrected security check word of the corrected message word. If correlation is found, step 70 is performed to indicate that the received message word is valid. If correlation is not found, step 72 is performed to request retransmission of word segments of the incorrectly received message word. Preferably retransmission of word segments when broadband, i.e. modulated carrier, is used, is at a different predetermined carrier frequency from prior retransmissions and transmissions in order to minimize the effect of noise on the message word. After a request for retransmission, steps 58 through 72 are performed as hereinbefore described. Steps 58 through 72 may be repeated until a valid message word is received.

Referring to FIG. 2, a block diagram of apparatus useful with the present invention is shown. A central receiver 40 comprises a transceiver 42, an error detector 44 and an error correction decoder 46. A remote transmitter 60 comprises a transceiver 62, an error detection and correction encoder 66 and a memory and memory controller 64. A communication system may comprise a plurality of remote transmitters which may be configured analogously to remote transmitter 60. An output of transceiver 42 is coupled to an input of transceiver 62 in order to supply the request transmission signal thereto and an output of transceiver 62 is coupled to an input of transceiver 42 in order to supply the message word/error correction function thereto. Another output of transceiver 42 is connected to an input of error detector 44 for supplying the received message word thereto. An output of error detector 44 has available the valid data word thereat. Another output of error detector 44 is coupled to error correction decoder 46 for supplying the received invalid message word thereto. Error correction decoder 46 is also supplied with the received error correction function from an output of transceiver 42 and provides the corrected message word to an input of error detector 44. Error detector 44 also supplies a retransmit signal and a transmit error correction function signal from respective outputs thereof to respective inputs of transceiver 42.

Error detection and correction encoder 66 is provided with the data word at a serial or preferably respective parallel inputs thereto. The message word to be transmitted is supplied from parallel outputs of error detection and correction encoder 66 to respective inputs of transceiver 62. Another group of parallel outputs are connected from error detection and correction encoder 66 to respective inputs of memory and memory controller 64 for supplying the error correction function thereto. Parallel outputs of memory and memory controller 64 are coupled to respective parallel inputs of transceiver 62 for providing the error correction function thereto. A transmit signal is supplied to each of error detection and correction encoder 66 and memory and memory controller 64 from a respective output of transceiver 62.

In operation, transceiver 42 may send a request transmission signal to transceiver 62. In response, transceiver 62 supplies a transmit message word signal to error detection and correction encoder 66. Error detection and correction encoder 66 is supplied with the data word and forms the appropriate message word therefrom. Error detection and correction encoder 66 also generates an error correction function for each respective segment of the message word or modified message word, as appropriate, and supplies the error correction functions to memory and memory controller 64 where they are stored for possible later transmission. The message word provided to transceiver 62 is transmitted to transceiver 42, preferably by interleaving the message word segments as hereinbefore described. The received message word is supplied to error detector 44. Error detector 44 checks the received message word and makes available at a respective output thereof the valid data word if the received security check word correlates with or corresponds to the received data word. If the message word is determined to be invalid, it is supplied to error correction decoder 46 and a transmit error correction function signal is provided to transceiver 42 which in turn transmits a request to transceiver 62 to transmit the respective error correction functions for the invalidly received message word. In response to the transmit error correction function signal, transceiver 62 supplies a transmit signal to memory and memory controller 64 which in turn supplies the corresponding error correction function to be transmitted to transceiver 62. Appropriate error correction functions are transmitted, preferably by interleaving as hereinbefore described, to transceiver 42. Received error correction functions are supplied to error correction decoder 46 which corrects the previously received invalid message word and provides a corrected message word to error detector 44. Error detector 44 checks the corrected message word using the respective corrected security check word. If the data word is determined to be valid, it is made available at the respective output of error detector 44. If the data word is not determined to be valid, a retransmit signal is provided to transceiver 42 which in turn supplies a request signal to transceiver 62 for retransmitting the original message word, preferably using a different predetermined carrier frequency, as hereinbefore described.

Although the system of the present invention has been described with respect to dividing a message word into word segments before generating an error correction function for each word segment, it is to be understood that it may be used in systems wherein the entire message word is first transmitted and a single error correction function for the entire message word is stored at the transmitter. Further, the present invention is not limited by the type of error correction function used. Additionally, the length of the message word is not so limited that each word segment into which the message word is divided is of proper length to form an error correction function since trailing logical zeros may be added to message wod segments to fill in the proper number of bits required to form an appropriate error correction function.

Thus has been illustrated and described, a data communication system wherein the probability of successful message reception is increased without increasing message traffic above that used with a conventional retry scheme. Further, the efficiency of a communication system having data signal paths with independently randomly varying electrical characteristics has been increased while the probability of correcting to a false message has been decreased.

While only certain preferred features of the invention have been shown by way of illustration, many modification and changes will occur to those skilled in the art. It is to be understood that the appended claims are intended to cover all such modifications and changes as fall within the true spirit and scope of the invention.

What is claimed is:

1. A method for improving reception of a data word to be sent from an origination station to a destination station, comprising:
   concatenating the data word and a security check word to form a message word;
   generating an error correction function for the message word;
   storing the error correction function for the message word;
   transmitting the message word to said destination station;
   using the security check word segment of the received message word to determine whether the received data word segment of the received message word has been validly received;
   transmitting the error correction function for the message word to said destination station when the received message word has not been verified as valid; and
   correcting errors in the received message word using the error correction function received at said destination station to form a corrected message word, wherein said corrected message word comprises a corrected data word and a corrected security check word.

2. The method as in claim 1, further comprising using the corrected security check word of the corrected message word to declare the corrected data word validly received.

3. The method as in claim 2, further comprising retransmitting the message word when the corrected data word is declared invalid.

4. The method as in claim 2, further comprising retransmitting the error correction function when the corrected data word is declared invalid.

5. The method as in claim 1, wherein said error correction function comprises a Golay code.

6. The method as in claim 5, wherein said Golay code comprises an extended Golay code.

7. The method as in claim 3, wherein the step of retransmitting the message word includes using a different predetermined carrier frequency from the transmitted frequency.

8. A method for improving reception of a data word to be sent from an origination station to a destination station, comprising:
   concatenating the data word and a security check word to form a message word;
   dividing said message word into a plurality of word segments;
   generating a respective error correction function for each of said plurality of word segments;
   storing the respective error correction function for each of said plurality of word segments;
   transmitting the message word to said destination station;
   using the security check word segment of the received message word to determine whether the data word segment of the received message word has been validly received;
   transmitting the respective error correction function for each of said plurality of word segments to said destination station when the received message word has been determined to be invalid; and
   correcting errors in each of said plurality of word segments using the respective error correction function received at said destination station to form a corrected message word, wherein said corrected message word comprises a corrected data word and a corrected security check word.

9. The method as in claim 8, further comprising using the corrected security check word of the corrected message word to declare the corrected data word validly received.

10. The method as in claim 9, further comprising retransmitting the message word when the correctd data word is declared invalid.

11. The method as in claim 10, wherein the step of retransmitting the message word further includes interleaving information from each of said plurality of word segments, whereby susceptibility to burst noise is reduced.

12. The method as in claim 9, further comprising retransmitting each respective error correction function when the corrected message word corrected data word is declared invalid.

13. The method as in claim 12, wherein one data bit is respectively transmitted from each of said plurality of word segments before a second data bit is transmitted from any of said plurality of word segments.

14. The method as in claim 8, wherein the step of transmitting the message word further includes interleaving information from each of said plurality of word segments, whereby susceptibility to burst noise is reduced.

15. The method as in claim 14, wherein one data bit is respectively transmitted from each of said plurality of word segments before a second data bit is transmitted from any of said plurality of word segments.

16. The method as in claim 8, wherein the step of transmitting the respective error correction function for each of said plurality of word segments further includes interleaving information from each said respective error correction function, whereby susceptibility to burst noise is reduced.

17. The method as in claim 14, wherein one data bit is respectively transmitted from each respective error correction function before a second data bit is transmitted from any of said respective error correction functions.

18. The method as in claim 8, wherein said error correction function comprises a Golay code.

19. The method as in claim 18, wherein said Golay code comprises an extended Golay code.

20. The method as in claim 10, wherein the step of retransmitting the message word includes using a different predetermined carrier frequency from the transmitted frequency.

21. A method for improving reception of a data word to be sent from an origination station to a destination station, comprising:
concatenating the data word and a security check word to form a message word;
dividing said message word into a first plurality of word segments;
interleaving said first plurality of word segments to form a modified message word;
dividing said modified message word into a second plurality of word segments;
generating a respective error correction function for each of said second plurality of word segments;
storing the respective error correction function for each of said second plurality of word segments;
transmitting the message word to said destination station;
using the security check word segment of said received message word to determine whether the data word segment of said received messagre word has been validly received;
transmitting the respective error correction function for each of said second plurality of word segments to said destination station when the received message word has not been verified as valid; and
correcting errors in each of said first plurality of segments using the respective error corection function received at said destination station to form a corrected message word, wherein said correctd message word comprises a corrected data word and a corrected security check word.

22. The method as in claim 21, further comprising using the corrected security check word of the corrected message word to declare the corrected data word validly received.

23. The method as in claim 22, further comprising retransmitting the message word when the corrected data word is declared invalid.

24. The method as in claim 21, wherein the step of interleaving said first plurality of word segments further includes sequentially arranging a single bit from respective corresponding bit positions of each respective word segment of said first plurality of word segments.

25. The method as in claim 21, wherein the step of transmitting the respective error correction function for each of said second plurality of word segments further includes interleaving information from each said respective error correction function, whereby susceptibility to burst noise is reduced.

26. The method as in claim 25, wherein one data bit is respectively transmitted from each respective error correction function before a second data bit is transmitted from any of said respective error correction functions.

27. The method as in claim 21, wherein said respective error correction function comprises a Golay code.

28. The method as in claim 27, wherein said Golay code comprises an extended Golay code.

29. The method as in claim 23, wherein the step of retransmitting the message word includes using a different predetermined carrier frequency from the transmitted frequency.

* * * * *